United States Patent
Sinclair (10) Patent No.: US 10,763,071 B2
(45) Date of Patent: Sep. 1, 2020

(54) COMPACT HIGH ENERGY ION IMPLANTATION SYSTEM

(71) Applicant: Varian Semiconductor Equipment Associates, Inc., Gloucester, MA (US)

(72) Inventor: Frank Sinclair, Boston, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 65 days.

(21) Appl. No.: 15/995,913

(22) Filed: Jun. 1, 2018

(65) Prior Publication Data
US 2019/0371562 A1  Dec. 5, 2019

(51) Int. Cl.
H01J 37/08 (2006.01)
H01J 37/05 (2006.01)
H05H 9/00 (2006.01)
H01J 37/317 (2006.01)

(52) U.S. Cl.
CPC .......... *H01J 37/05* (2013.01); *H01J 37/3171* (2013.01); *H05H 9/00* (2013.01); *H01J 2237/31701* (2013.01)

(58) Field of Classification Search
CPC .......... H01J 37/04; H01J 37/08; H01J 37/248; H01J 37/3171; H01J 2237/0048; H01J 2237/0815; H01J 2237/04735; H01J 2237/04756; H05H 5/02
See application file for complete search history.

(56) References Cited

U.S. PATENT DOCUMENTS

| | | |
|---|---|---|
| 4,383,180 A | 5/1983 | Turner |
| 4,667,111 A | 5/1987 | Glavish et al. |
| 5,504,341 A | 4/1996 | Glavish |
| 6,208,095 B1 | 3/2001 | DiVergilio et al. |
| 6,242,747 B1 | 6/2001 | Sugitani et al. |
| 6,262,638 B1 | 7/2001 | Scherer |
| 6,423,976 B1 | 7/2002 | Glavish et al. |
| 6,583,429 B2 | 6/2003 | Saadatmand et al. |
| 6,635,890 B2 | 10/2003 | Saadatmand et al. |
| 6,639,227 B1 | 10/2003 | Glavish et al. |
| 6,653,643 B2 | 11/2003 | Saadatmand et al. |
| 6,653,803 B1 | 11/2003 | DiVergilio et al. |
| 7,402,821 B2 | 7/2008 | Bernhardt |
| 9,343,263 B2 | 5/2016 | Sasaki et al. |
| 9,355,847 B2 | 5/2016 | Kabasawa et al. |
| 9,368,327 B2 | 6/2016 | Kabasawa et al. |

(Continued)

OTHER PUBLICATIONS

International Search Report and Written Opinion dated Sep. 17, 2019 for International application PCT/US2019/033460 filed May 22, 2019.

(Continued)

*Primary Examiner* — David E Smith
*Assistant Examiner* — Hsien C Tsai (57) ABSTRACT

An apparatus may include an ion source, arranged to generate an ion beam at a first ion energy. The apparatus may further include a DC accelerator column, disposed downstream of the ion source, and arranged to accelerate the ion beam to a second ion energy, the second ion energy being greater than the first ion energy. The apparatus may include a linear accelerator, disposed downstream of the DC accelerator column, the linear accelerator arranged to accelerate the ion beam to a third ion energy, greater than the second ion energy.

19 Claims, 4 Drawing Sheets

(56) References Cited

U.S. PATENT DOCUMENTS

| | | |
|---|---|---|
| 9,390,889 B2 | 7/2016 | Watanabe et al. |
| 9,390,890 B2 | 7/2016 | Kabasawa et al. |
| 2004/0256578 A1 | 12/2004 | Mitchell et al. |
| 2009/0072163 A1 | 3/2009 | Lubicki et al. |
| 2009/0206275 A1* | 8/2009 | Henley ............... H01J 37/3171 250/424 |
| 2011/0101213 A1* | 5/2011 | Satoh ..................... H01J 37/08 250/282 |
| 2015/0200073 A1* | 7/2015 | Jen ..................... H01J 37/3171 250/282 |

OTHER PUBLICATIONS

Introduction of the S-UHE, a Single-Wafer Ultra-High Energy Ion Implanter, Kazuhiro Watanabe, Haruka Sasaki, Mitsuaki Kabasawa, Mitsukuni Tsukihara, Kazuyoshi Ueno; Published in: 2014 20th International Conference on Ion Implantation Technology (IIT); Date of Conference: Jun. 26-Jul. 4, 2014; DOI: 10.1109/IIT.2014.6940021; Electronic ISBN: 978-1-4799-5212-0, 4 pages.

Symmetric beam line technique for a single-wafer ultra-high energy ion implanter, Shiro Ninomiya, Haruka Sasaki, Koji Inada, Koji Kato, Yoshitaka Amano, Kazuhiro Watanabe, Mitsuaki Kabasawa, Hiroyuki Kariya, Mitsukuni Tsukihara, Kazuyoshi Ueno; Conference Paper—Jun. 2014; DOI: 10.1109/IIT.2014.6940029; Conference: 2014 20th International Conference on Ion Implantation Technology (IIT); 4 pages.

* cited by examiner

COMPACT HIGH ENERGY ION IMPLANTATION SYSTEM

FIELD OF THE DISCLOSURE

The disclosure relates generally to ion implantation apparatus and more particularly to high energy beamline ion implanters.

BACKGROUND OF THE DISCLOSURE

Ion implantation is a process of introducing dopants or impurities into a substrate via bombardment. Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp.

Implantation apparatus capable of generating ion energies of approximately 1 MeV or greater are often referred to as high energy ion implanters, or high energy ion implantation systems. One type of high energy ion implanter employs a so-called tandem acceleration architecture where ions are accelerated through a first column to high energy, undergo charge exchange to change polarity, and then are accelerated to a second energy, approximately double the first energy in a second column. Another type of high energy ion implanter is termed linear accelerator, or LINAC, where a series of electrodes arranged as tubes conduct and accelerate the ion beam to increasingly higher energy along the succession of tubes, where the electrodes receive an AC voltage signal. Standard LINACs are driven by a 13.56 MHz (or maybe in the range 10-20 MHz) signal using a resonator circuit including coil and capacitor. Overall, standard LINACs employing 13.56 MHz resonators employ many accelerator stages and accordingly many resonators to accelerate an initially low energy ion beam to a target ion energy, requiring a relatively large footprint for operation. With respect to these and other considerations, the present disclosure is provided.

BRIEF SUMMARY

Various embodiments are related to novel ion implantation apparatus. In one embodiment, an apparatus may include an ion source, arranged to generate an ion beam at a first ion energy. The apparatus may further include a DC accelerator column, disposed downstream of the ion source, and arranged to accelerate the ion beam to a second ion energy, the second ion energy being greater than the first ion energy. The apparatus may include a linear accelerator, disposed downstream of the DC accelerator column, the linear accelerator arranged to accelerate the ion beam to a third ion energy, greater than the second ion energy.

In another embodiment, a method for producing a high energy ion beam, may include generating an ion beam at an ion source at a low ion energy. The method may include accelerating the ion beam through a DC accelerator column to an intermediate ion energy, the intermediate ion energy being greater than 200 keV. The method may further include accelerating the ion beam in a linear accelerator, disposed downstream of the DC accelerator column, to a high energy, greater than 1 MeV.

In a further embodiment, a compact high energy ion implantation system is provided, including an ion source and extraction system, arranged to generate an ion beam at a first energy. The system may further include a DC accelerator column, disposed downstream of the ion source, and arranged to accelerate the ion beam to an intermediate ion energy, the intermediate ion energy being greater than 200 keV. The system may include an analyzer, disposed downstream of the DC accelerator column, and arranged to alter a trajectory of the ion beam; and a linear accelerator, disposed downstream of the analyzer, the linear accelerator arranged to accelerate the ion beam to a high energy, greater than 1 MeV.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved high energy ion implantation systems, based upon a beamline architecture. For brevity, an ion implantation system may also be referred to herein as an "ion implanter." Various embodiments provide novel configurations for providing the capability of generating high energy ions, where the final ion energy delivered to a substrate may be 1 MeV or greater. One aspect of embodiments of the present disclosure is a novel combination of two different acceleration sub-systems, providing various advantages over known beamline architecture. In exemplary embodiments, a DC accelerator column is provided in series with a novel linear accelerator to generate a high energy ion beam in a compact beamline architecture.

Figure 1:
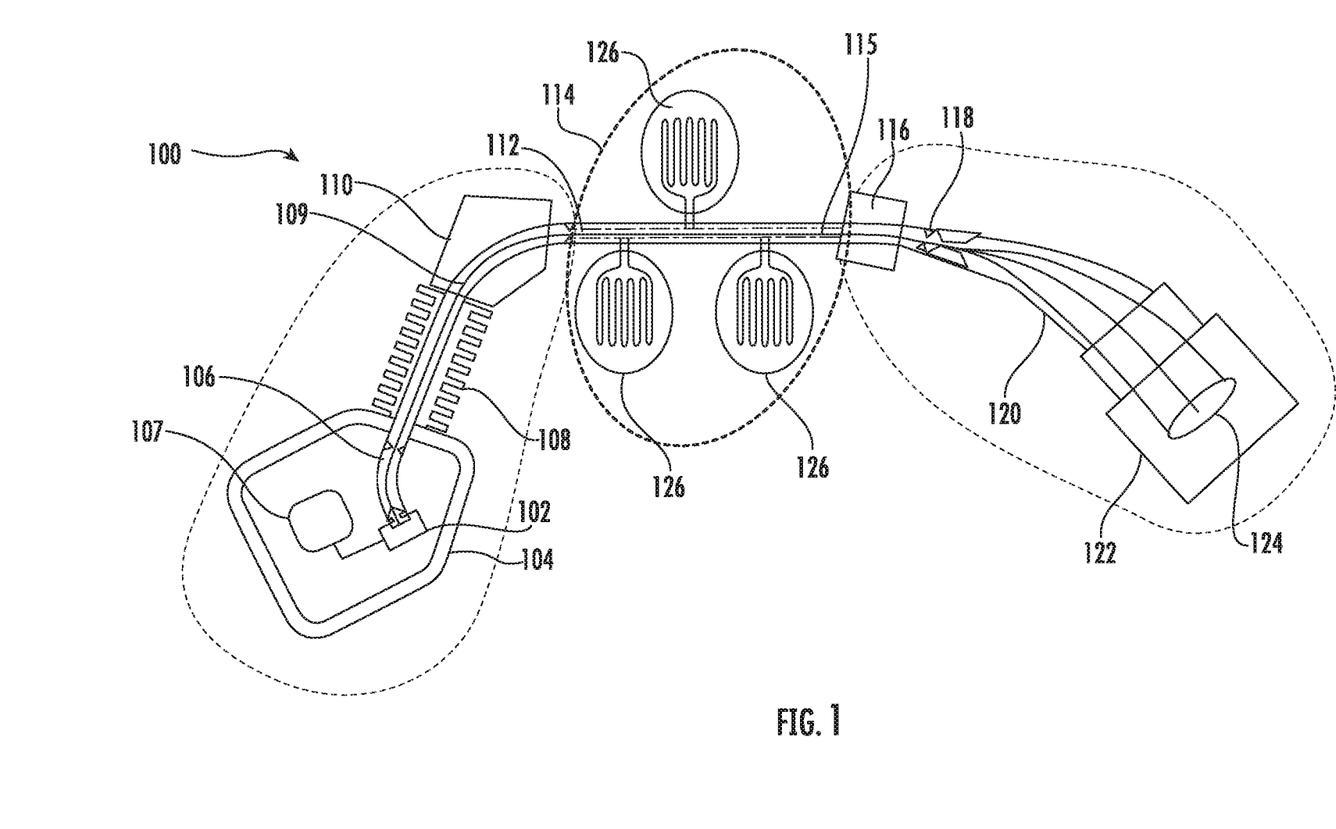
FIG. 1 shows an exemplary embodiment demonstrating an apparatus, according to embodiments of the disclosure.

Referring now to FIG. 1, an exemplary apparatus is shown in block form. The apparatus 100 may represent a beamline ion implanter, with some elements not shown for clarity of explanation. The apparatus 100 may include an ion source 102, and a gas box 107 disposed in a terminal 104 as known in the art. The ion source 102 may include an extraction system including extraction components and filters (not shown) to generate an ion beam 106 at a first energy. Examples of suitable ion energy for the first ion energy range from 5 keV to 100 keV, while the embodiments are not limited in this context. To form a high energy ion beam, the apparatus 100 includes various additional components for accelerating the ion beam 106. The apparatus 100 includes a DC accelerator column 108, disposed downstream of the ion source 102, and arranged to accelerate the ion beam 106 to produce an accelerated beam 109 at a second ion energy, where the second ion energy is greater than the first ion energy, generated by the ion source 102. The DC accelerator column 108 may be arranged as in known DC accelerator column, such as those columns used in medium energy ion implanters.

The apparatus 100 may include an analyzer 110, functioning to analyze the accelerated ion beam 109 as in known apparatus, by changing the trajectory of the ion beam 106, as shown. The apparatus 100 may also include a buncher 112, and a linear accelerator 114 (shown in the dashed line), disposed downstream of the DC accelerator column 108, where the linear accelerator 114 is arranged to accelerate the accelerated ion beam 109 to form a high energy ion beam 115 at a third energy, greater than the second energy. The linear accelerator 114 may include a plurality of accelerator stages 126, arranged in series, as shown. In various embodiments, the third energy may represent the final ion energy for the ion beam 106, or approximately the final ion energy. In various embodiments, the apparatus 100 may include additional components, such as filter magnet 116, a scanner 118, collimator 120, where the general functions of the scanner 118 and collimator 120 are well known and will not be described herein in further detail. As such, a high energy ion beam, represented by the high energy ion beam 115, may be delivered to an end station 122 for processing a substrate 124.

A hallmark of the apparatus 100 is the coupling of a DC accelerator stage in series with a linear accelerator. In various embodiments, the DC accelerator stage 108 may accelerate the ion beam 106 to an energy of 200 keV or greater. As an example, the ion beam 106 may be extracted from ion source 102 and provided with a first energy in the range of 20 keV to 80 keV, where the DC accelerator stage accelerates the ion beam 106 to generate the accelerated ion beam 109 at a second energy of 500 keV. The accelerated ion beam 109, having an energy of 500 keV is then conducted into the linear accelerator 114 for further acceleration. Advantages of providing the accelerated ion beam 109 with a relatively high energy to the linear accelerator 114 are detailed below.

According to various embodiments of the disclosure, the linear accelerator 114 may include a plurality of accelerator stages to further accelerate the accelerated ion beam 109 to a high energy. In some embodiments, the accelerator stages of the linear accelerator 114 may be a double gap accelerator stage, while in other embodiments the accelerator stages of the linear accelerator 114 may be a triple gap accelerator stage. In particular embodiments, the linear accelerator 114 may include at least three triple gap accelerator stages.

Figure 2:
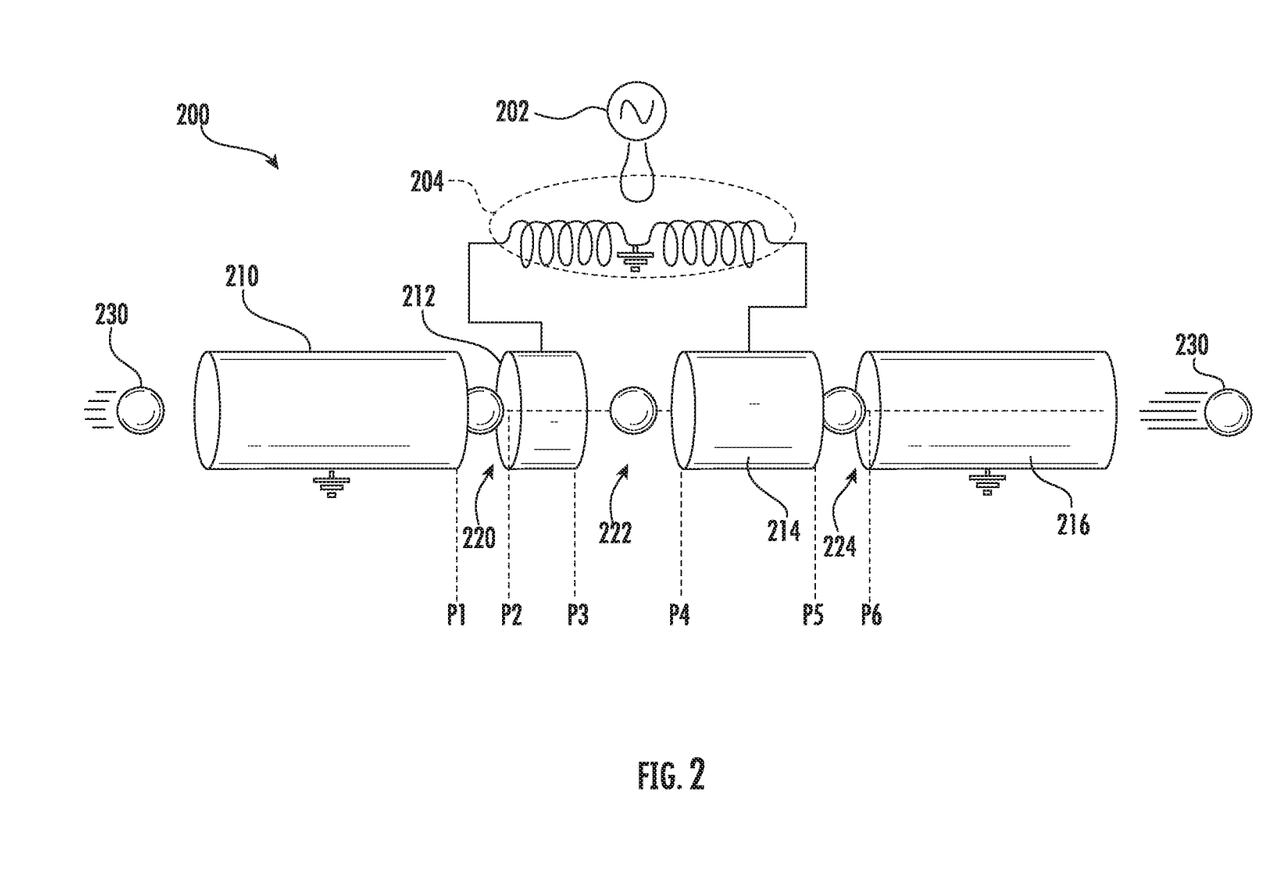
FIG. 2 shows the structure of an exemplary accelerator stage of a linear accelerator, according to embodiments of the disclosure.
Figure 3:
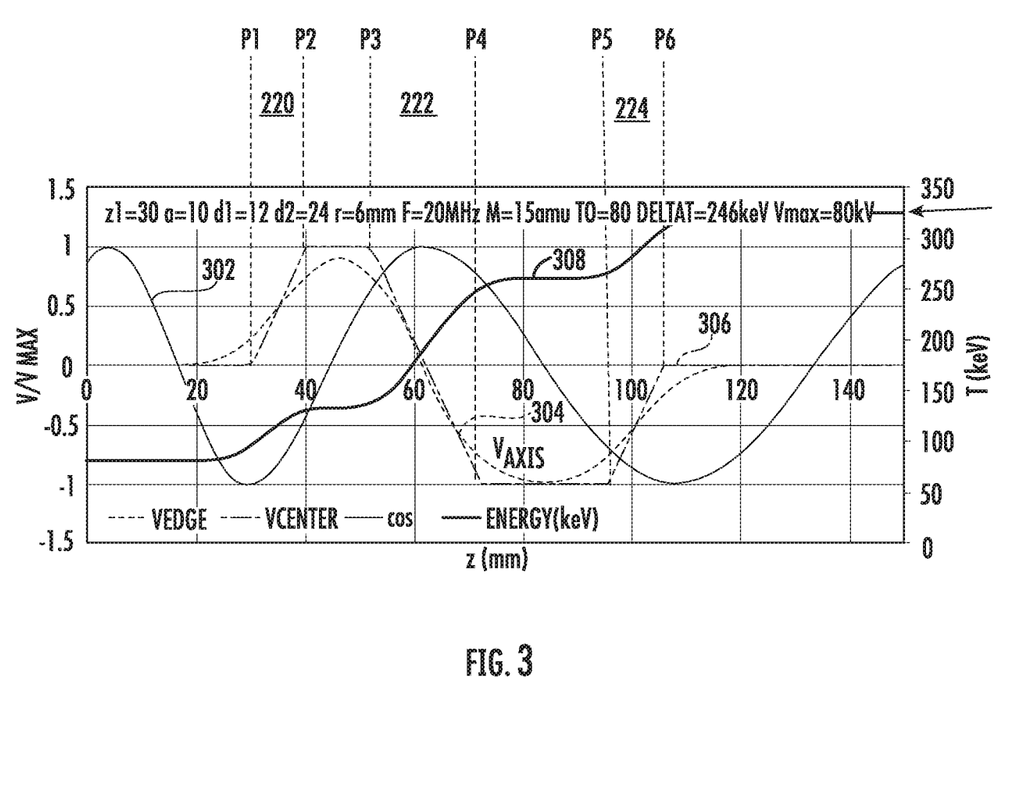
FIG. 3 is a graph illustrating various parameters associated with the accelerator stage of the linear accelerator of FIG. 2.

FIG. 2 shows the structure of an exemplary accelerator stage of a linear accelerator, according to embodiments of the disclosure. FIG. 3 is a graph illustrating various parameters associated with the accelerator stage of the linear accelerator of FIG. 2. More particularly, FIG. 2 shows an embodiment of an accelerator stage 200, arranged as a triple gap accelerator stage. As is known, a linear accelerator (LINAC) receives an ion beam as a bunched ion beam. The bunched ion beam may be accelerated in two gaps within a double gap accelerator stage or in three gaps within a triple gap accelerator stage.

The configuration of FIG. 2 illustrates a triple gap accelerator stage, including a resonator 204, a high frequency generator 202, coupled to the resonator 204, and a series of acceleration drift tubes, shown as drift tube 210, drift tube 212, drift tube 214, and drift tube 216. The term "drift tube" is known to indicate a cavity or region of the beamline surrounded by a conductor at a controlled potential so no electric fields penetrate into the interior of the tube, but the electric fields are confined to the entrance and exit regions of the drift tube. Thus, the charged particle will travel at a constant speed or "drift" through this drift tube. The high frequency generator 202 may generate a radio frequency signal, such as 20 MHz or greater, and in some embodiments, may generate a 40 MHz signal. The resonator 204 may be configured as a step-up transformer to act as a voltage source to generate a high voltage, high frequency signal, such as a radio frequency voltage signal. This high voltage signal is used to control the voltage of the drift tubes and thus define the acceleration provided by the accelerator stage 200. A series of accelerator stages, arranged generally as shown in FIG. 2, may be arranged in series to incrementally increase the ion energy to a final targeted ion energy.

Various considerations may be taken into account according to the embodiments of the disclosure for determining the length of drift tubes within an accelerator stage, as well as the number of accelerator stages in a linear accelerator, such as linear accelerator 114. To begin with, a brief description of the operating principles of accelerator stage 200 is provided. As shown in the configuration of FIG. 2, the first acceleration drift tube, drift tube 210, receives an ion beam 230 having a given ion energy, which ion energy is determined by the DC acceleration column 108. The RF voltage may be provided as an AC signal 302, shown in FIG. 3, where the AC signal 302 is shown along the z axis value corresponding to the time when the bunch of ions is at that location. As the bunch accelerates, the wavelength of this bunch gets longer, even though the temporal frequency is fixed. The bunch (represented by ion beam 230) is then accelerated through the accelerator stage 200 by application of an RF signal, applied to drift tubes of the accelerator stage. The RF signal may have a suitable shape, such as sinusoidal, as shown by the exemplary applied signal, AC signal 302, in FIG. 3. The AC signal 302 may be characterized by a maximum amplitude of applied voltage, Vmax, where the AC signal is applied between the drift tube 212 and the drift tube 214. Thus, the maximum value of voltage applied between drift tube 212 and drift tube 214 is 2Vmax. Notably, drift tube 210, and the final drift tube, drift tube 216, are grounded.

As further shown in FIG. 2, the accelerator stage 200 is characterized by a gap 220, between an end of drift tube 210 at point P1 and a beginning of drift tube 212 at point P2. The accelerator stage is further characterized by a gap 222, between an end of drift tube 212 at point P3 and a beginning of drift tube 214 at point P4. The accelerator stage is further characterized by a gap 224, between an end of drift tube 214 at point P5 and a beginning of drift tube 216 at point P6. Notably, within a given drift tube, the ion beam 230 does not accelerate, and merely drifts through the given drift tube at a given velocity. At each gap of the accelerator stage 200, the AC signal switches to accelerate the ion beam 230 (as a bunched ion beam) between adjacent drift tubes.

For a given AC voltage signal having a Vmax, the maximum amount of added energy imparted to the ion beam 230 may be shown to be equal to 4qVmax, where q is the charge on the ion. This maximum energy may be imparted to the ion beam 230 when the tube length of a given drift tube is matched to the velocity of the bunched ion beam. If the tube length is too long or too short, the amount of energy imparted to the ion beam across a given gap is less than $2V_{max}$ of added energy. As is well known, the velocity of an ion depends merely on the ion energy and the ion mass—and is independent of the charge state of the ion. Thus, the maximum energy is typically higher for higher mass ions. Accordingly, the tube length of a given drift tube of the accelerator stage 200 may be designed by consideration of the ion energy and ion mass of ions to be used in the ion beam 230. As an example, the injection energy is to be higher for higher mass ions, as compared to lower mass ions.

Since components of a linear accelerator including the accelerator stages may not be easily switchable, the design of the various drift tubes of a given accelerator stage may account for various ion species and ion energies to be employed in an apparatus, such as apparatus 100. By way of reference, for known LINACs, generators have usually been restricted to operation at 13.56 MHz. In principle, 40 MHz power supplies including a 40 MHz generator may be used to drive a LINAC, where the resonator size may be scaled down accordingly as compared to a 13.56 MHz resonator. Notably, to obtain maximum voltage increase in a given tube, the tube length is matched to the energy of the ions. Thus, tube length increases along the beamline as the ion energy is increased. As detailed below, for heavier ions and lower energies, a shorter tube length is needed. For example, for a 100 keV phosphorous ion energy, a tube length of approximately 1 cm is called for in the case of 40 MHz resonator. Such a small length may be incompatible with beam control, where a width of the ion beam and thus the minimum inner diameter of the drift tube, may be on the order of one centimeter. With such a short length, the electric fields will penetrate the entire "length" of the drift tube, rendering the drift tube ineffective. For 13.56 MHz resonators, an ideal tube length in the case of 80 keV phosphorous is approximately 3 cm, presenting a more compatible geometry for conducting an ion beams as the ion beam enter the series of tubes to undergo acceleration to high energy. A disadvantage of such 13.56 MHz LINAC systems is the relatively larger resonators, and the concomitant larger LINAC, generating a large footprint for such ion implanters.

Table I provides a listing of ideal tube length for different ion species, hydrogen, boron, and phosphorous, shown as a function of ion energy up to 10 MeV. This length is the distance the specified ion travels in a time corresponding to 180° or π radians of the AC voltage. The tube length is also a function of signal frequency, and is shown for 13.56 MHz, commonly used in linear accelerators, as well as for a frequency of 40 MHz, where the present embodiments may employ 40 MHz technology. Notably, for ion energy of 160 keV or less (0.16 MeV), the ideal tube length is quite small, 4 cm or less for phosphorous. At 40 MHz, the tube length for phosphorus ions is approximately 1 cm for 160 keV or 80 keV. Given that a beam width for an ion beam may be on the order of 1 cm in some examples, optics for suitably controlling the ion beam may dictate a tube length longer than the beam width, such as at least two or three centimeters. Accordingly, Table I highlights one reason for use of 13.5 MHz frequency in known beamline ion implanters employing a linear accelerator exclusively for accelerating ions, and lacking the DC accelerator column of the present embodiments. In other words, the known linear accelerator beamline implanters may generate an ion energy on the order of 80 keV or lower for an ion beam entering the linear accelerator. The lower frequency (13.56 MHz) RF generators allow tube lengths for linear accelerators on the order of 3 cm for phosphorous, adequate for suitable beam control for a 1 cm ion beam. Notably, at 40 MHz, as discussed above, the ideal tube length for accelerating the ion beam is too short (0.6 cm) for constructing a proper drift tube to control the 1 cm phosphorous ion beam.

In view of the above, the configuration of the apparatus 100 provides an advantage over known beamline implanters than employ a linear accelerator exclusively for accelerating an ion beam. Notably, because the DC accelerator column may accelerate ions to an energy of 500 keV, for example, the ideal tube length at this energy for accelerating a phosphorous ion beam is on the order of 2 cm, an adequate length to construct a drift tube to properly control a 1 cm ion beam.

TABLE I

| Length of π drift @ 13.56 MHz (cm) | | | | |
|---|---|---|---|---|
| Energy (MeV) | Element A(amu) | B 11 | P 31 | As 75 |
| 0.08 | | 4.4 | 2.6 | 1.7 |
| 0.2 | | 6.9 | 4.1 | 2.6 |
| 0.5 | | 11 | 6.5 | 4.2 |
| 1 | | 15 | 9.2 | 5.9 |
| 2 | | 22 | 13 | 8.4 |
| 3 | | 27 | 16 | 10 |
| 4 | | 31 | 18 | 12 |
| 5 | | 35 | 21 | 13 |
| 6 | | 38 | 23 | 14 |
| 10 | | 49 | 29 | 19 |
| Length of π drift @ 40 MHz (cm) | | | | |
| Energy (MeV) | Element A(amu) | B 11 | P 31 | As 75 |
| 0.08 | | 1.5 | 0.9 | 0.6 |
| 0.2 | | 2.3 | 1.4 | 0.9 |
| 0.5 | | 3.7 | 2.2 | 1.4 |
| 1 | | 5.2 | 3.1 | 2.0 |
| 2 | | 7.4 | 4.4 | 2.8 |
| 3 | | 9.1 | 5.4 | 3.5 |

TABLE I-continued

| 4 | 10 | 6.2 | 4.0 |
|---|----|-----|-----|
| 5 | 12 | 7.0 | 4.5 |
| 6 | 13 | 7.6 | 4.9 |
| 10 | 17 | 10 | 6.3 |

L = V/(2F) = sqrt(2E/M)/(2F)

A further advantage of using a 40 MHz voltage signal to accelerate an ion beam in an accelerator stage is the concomitant reduction in size of a resonator as compared to a 13.56 MHz resonator. The size of a resonator may be inversely proportional to the frequency of the AC field through the resonator, leading to a substantially smaller resonator size when scaling between known 13.56 MHz resonators and 40 MHz resonators.

As noted, to properly couple the voltage supplied to an accelerator stage composed of a series of drift tubes, the drift tube length should be appropriate for the ion energy and mass of the ion species. Returning to FIG. 3, there is further shown the results of modeling for an applied RF voltage, where Vmax is 80 kV, frequency is 20 MHz, and drift tubes are selected to generate a peak at approximately m/q=15, where q is charge and m is mass. The voltage is assumed to vary as $V=V_{max} \cos(\omega t+\phi)$. The AC phase changes as the bunched ion beam (ion beam 230) moves through each drift tube. The curve 304 represents the voltage along the central axis of the drift tubes while the curve 306 represents the voltage at the edge of the drift tubes. The curve 308 represents the ion energy, with an initial energy entering the accelerator stage of 80 keV. The gap 220 has a length of 10 mm, the gap 222 has a length of 20 mm, and the gap 224 has a length of 10 mm, the length of drift tube 212 is 12 mm, while the length of drift tube 214 is 24 mm. The mass of ion beam 230 is assumed to be 15 amu. As shown, the ion energy increases in three increments over the three gaps, with a final energy of approximately 330 keV, out of a theoretical maximum of 400 keV (given Vmax of 80 keV and injection energy of 80 keV).

In accordance with various embodiments, a plurality of accelerator stages may be arranged in series to boost the ion energy to a target value, where each accelerator stage adds to the energy. While the phase of a first voltage signal of a first accelerator stage may be in phase with the phase of a second voltage signal of a second accelerator stage, in some embodiments, at least one other accelerator stage may be coupled to receive a second voltage signal, out-of phase with respect to the first voltage signal of a first accelerator stage.

Figure 4:
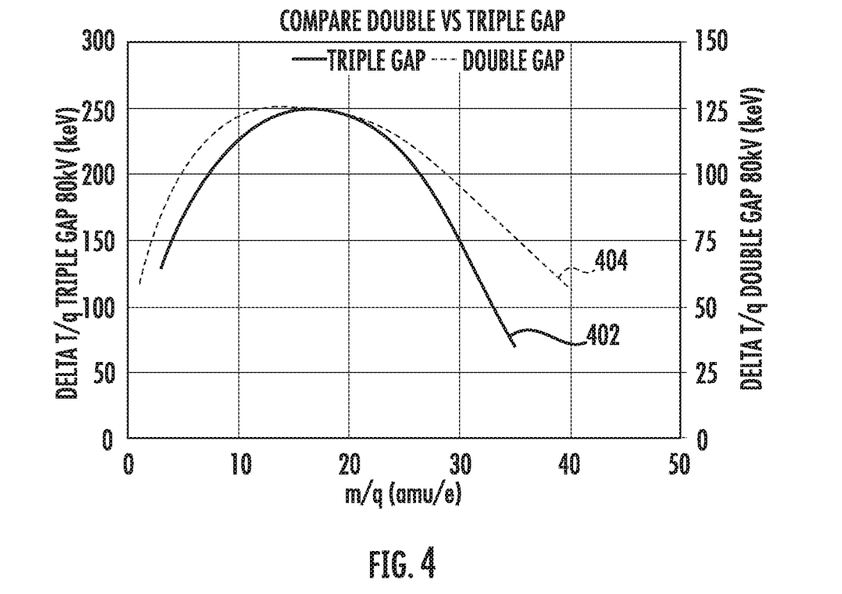
FIG. 4 presents modeling results for accelerator stages of a LINAC, arranged according to embodiments of the disclosure.

Turning to FIG. 4, there is shown the energy boost of an accelerator stage as a function of ion mass (expressed as m/q), arranged according to embodiments of the disclosure. The curve 402 represents the energy increase generated by a triple gap accelerator stage, as described above with respect to FIG. 2 and FIG. 3. The curve 402 represents the energy increase generated by a double gap accelerator stage, where in both cases an 80 kV Vmax is assumed. The triple gap accelerator stage yields double the energy increase at peak for a given Vmax, while the double gap accelerator stage has a wider range where the energy increase remains near peak. Notably, the energy boost from the triple gap accelerator stage configuration is still 80% of maximum energy boost between m/q of 7 to 25.

Figure 5:
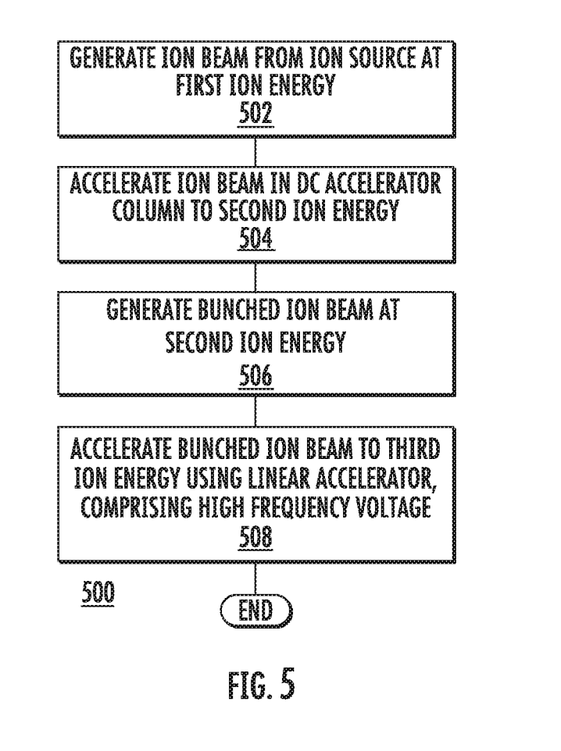
FIG. 5 depicts an exemplary process flow according to some embodiments of the disclosure.

FIG. 5 depicts an exemplary process flow 500 according to some embodiments of the disclosure. At block 502, an ion beam is generated from an ion source, having a first ion energy. The first ion energy may be imparted by extracting the ion beam using known extraction apparatus, where the energy may vary between 5 keV and 100 keV in some embodiments. At block 504 the ion beam is accelerated through a DC accelerator column to a second ion energy. In some examples, the second ion energy may be as high as 500 keV. At block 506, a bunched ion beam is generated by a buncher, where the bunched ion beam is formed from the ion beam, received from the DC accelerator column. As such, the bunched ion beam may retain the second ion energy. At block 508, the bunched ion beam is accelerated to a third ion energy using a linear accelerator. According to various embodiments, the linear accelerator may accelerate the bunched ion beam to an ion energy of 1 MeV or greater.

In view of the foregoing, at least the following advantages are achieved by the embodiments disclosed herein. By providing a DC acceleration subsystem to inject ions at relatively high energy, the present embodiments provide the advantage of a smaller overall footprint for a high energy ion implanter as compared to known linear accelerators. A related advantage is the shorter accelerator drift tubes used to generate a final beam energy, meaning the LINAC subsystem is shorter, and the overall tool is more compact. An additional advantage afforded by the present embodiments is the ability to use higher frequency resonators, meaning smaller resonators, because of the higher injection energy. A further related advantage is the ability to reduce breakdown risk by operating at higher frequency, eliminating the need to use cumbersome insulation means, such as $SF_6$.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An apparatus, comprising:
   an ion source and extraction system, arranged to generate an ion beam at a first ion energy;
   a DC accelerator column, disposed downstream of the ion source, and arranged to accelerate the ion beam to a second ion energy, the second ion energy being greater than the first ion energy; and
   a linear accelerator, disposed downstream of the DC accelerator column, the linear accelerator arranged to accelerate the ion beam to a third ion energy, greater than the second ion energy.

2. The apparatus of claim 1, wherein the linear accelerator comprises at least one triple gap accelerator stage.

3. The apparatus of claim 2, wherein the linear accelerator comprises at least three triple gap accelerator stages.

4. The apparatus of claim 1, wherein the linear accelerator comprises at least one accelerator stage, comprising a resonator, and a high frequency generator, coupled to the resonator, the high frequency generator producing a signal having a frequency greater than 20 MHz.

5. The apparatus of claim 4, wherein the signal comprises a frequency of 40 MHz.

6. The apparatus of claim 1, the linear accelerator further comprising a buncher, disposed between the DC accelerator column and the linear accelerator.

7. The apparatus of claim 1, wherein the linear accelerator comprises a plurality of accelerator stages, wherein at least one accelerator stage is coupled to a first voltage source to receive a first voltage signal, wherein at least one other accelerator stage is coupled to receive a second voltage signal, out-of phase with respect to the first voltage signal.

8. The apparatus of claim 1, wherein the second ion energy is 200 keV or greater, and wherein the third energy is 1 MeV or greater.

9. A method for producing a high energy ion beam, comprising:
   generating an ion beam at an ion source at a low ion energy;
   accelerating the ion beam through a DC accelerator column to an intermediate ion energy, the intermediate ion energy being greater than 200 keV; and
   accelerating the ion beam in a linear accelerator, disposed downstream of the DC accelerator column, to a high energy, greater than 1 MeV.

10. The method of claim 9,
   wherein the linear accelerator comprises at least one triple gap accelerator stage.

11. The method of claim 10, wherein the linear accelerator comprises at least three triple gap accelerator stages.

12. The method of claim 9, wherein the linear accelerator comprises at least one accelerator stage, comprising a resonator, and a 40 MHz generator, coupled to the resonator.

13. The method of claim 9, the linear accelerator further comprising a buncher, disposed between the DC accelerator column and the linear accelerator.

14. The method of claim 9, wherein the linear accelerator comprises a plurality of accelerator stages, wherein the accelerating the ion beam in the linear accelerator comprises: applying a first voltage signal to a first accelerator stage of the linear accelerator; and applying a second voltage signal to a second accelerator stage of the linear accelerator, wherein the second voltage signal is out-of phase with respect to the first voltage signal.

15. The method of claim 9, wherein the linear accelerator comprises a plurality of accelerator stages, driven by a plurality of radio frequency voltage signals, respectively.

16. The method of claim 15, wherein a frequency of the plurality of radio frequency voltage signals in 40 MHz.

17. The method of claim 9, further comprising directing the ion beam through an analyzer between the DC accelerator column and the linear accelerator.

18. A compact high energy ion implantation system, comprising:
   an ion source and extraction system, arranged to generate an ion beam at a first energy;
   a DC accelerator column, disposed downstream of the ion source, and arranged to accelerate the ion beam to an intermediate ion energy, the intermediate ion energy being greater than 200 keV;
   an analyzer, disposed downstream of the DC accelerator column, and arranged to alter a trajectory of the ion beam; and
   a linear accelerator, disposed downstream of the analyzer, the linear accelerator arranged to accelerate the ion beam to a high energy, greater than 1 MeV.

19. The compact high energy ion implantation system of claim 18, wherein the linear accelerator comprises a plurality of triple gap accelerator stages.

* * * * *